(12) United States Patent
Masuda

(10) Patent No.: US 8,765,617 B2
(45) Date of Patent: Jul. 1, 2014

(54) METHOD OF MANUFACTURING SEMICONDUCTOR DEVICE

(75) Inventor: Takeyoshi Masuda, Osaka (JP)

(73) Assignee: Sumitomo Electric Industries, Inc., Osaka-shi (JP)

( * ) Notice: Subject to any disclaimer, the term of this patent is extended or adjusted under 35 U.S.C. 154(b) by 0 days.

(21) Appl. No.: 13/415,319

(22) Filed: Mar. 8, 2012

(65) Prior Publication Data

US 2012/0231618 A1 Sep. 13, 2012

Related U.S. Application Data

(60) Provisional application No. 61/450,773, filed on Mar. 9, 2011.

(30) Foreign Application Priority Data

Mar. 9, 2011 (JP) ................................ 2011-050927

(51) Int. Cl.
*H01L 21/469* (2006.01)
*H01L 21/31* (2006.01)

(52) U.S. Cl.
USPC ........... 438/791; 438/514; 438/530; 438/542; 438/559; 438/931; 257/77; 257/758; 257/E21.055

(58) Field of Classification Search
None
See application file for complete search history.

(56) References Cited

U.S. PATENT DOCUMENTS

| | | | |
|---|---|---|---|
| 6,764,963 B2 * | 7/2004 | Fukuda et al. | 438/778 |
| 6,939,756 B1 * | 9/2005 | Chung et al. | 438/198 |
| 7,022,378 B2 * | 4/2006 | Das et al. | 427/255.29 |
| 7,855,131 B2 * | 12/2010 | Fujiwara et al. | 438/476 |
| 2009/0090919 A1 * | 4/2009 | Uchida | 257/77 |

FOREIGN PATENT DOCUMENTS

| | | | |
|---|---|---|---|
| JP | 7-086199 A | | 3/1995 |
| JP | 2004335815 A | * | 11/2004 |
| JP | 2010-262952 A | | 11/2010 |

* cited by examiner

*Primary Examiner* — Zandra Smith
*Assistant Examiner* — Khanh Duong
(74) *Attorney, Agent, or Firm* — Venable LLP; Michael A. Sartori; Tamatane J. Aga

(57) ABSTRACT

A method of manufacturing a MOSFET includes the steps of preparing a substrate with an epitaxial growth layer made of silicon carbide, performing ion implantation into the substrate with the epitaxial growth layer, forming a protective film made of silicon nitride on the substrate with the epitaxial growth layer into which the ion implantation was performed, and heating the substrate with the epitaxial growth layer on which the protective film was formed to a temperature range of 1600° C. or more in an atmosphere containing gas including a nitrogen atom.

6 Claims, 5 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device, and more particularly to a method of manufacturing a semiconductor device capable of suppressing surface roughness of a substrate made of silicon carbide during activation annealing for activating an impurity introduced into the substrate.

2. Description of the Background Art

In recent years, silicon carbide has been increasingly used as a material for a semiconductor device in order to realize a higher breakdown voltage, loss reduction, use in a high-temperature environment and the like of the semiconductor device. Silicon carbide is a wide band gap semiconductor having a wider band gap than that of silicon which has been conventionally and widely used as a material for a semiconductor device. By using silicon carbide as a material for a semiconductor device, therefore, a higher breakdown voltage, on-resistance reduction and the like of the semiconductor device can be achieved. A semiconductor device made of silicon carbide also has the advantage of exhibiting less performance degradation when used in a high-temperature environment than a semiconductor device made of silicon.

In a method of manufacturing such semiconductor device made of silicon carbide, a desired impurity is introduced into a substrate made of silicon carbide, and then activation annealing for activating the impurity is carried out. Here, the activation annealing of the substrate made of silicon carbide needs to be carried out at a high temperature. As a result, surface roughness of the substrate may occur due to the activation annealing. It is desirable to reduce this surface roughness since it may adversely affect the performance of the manufactured semiconductor device.

To address this problem, a method of manufacturing a silicon carbide semiconductor device has been proposed, in which a surface of a region into which ion implantation was performed is covered with a silicon nitride film prior to activation annealing of an impurity introduced by the ion implantation (e.g., see Japanese Patent Laying-Open No. 7-86199 (Patent. Literature 1)).

During the above activation annealing, however, the substrate needs to be heated to a high temperature of 1600° C. or more. In the method of manufacturing a semiconductor device described in Patent Literature 1, therefore, a crack may occur in the silicon nitride film due to the difference in coefficient of linear expansion between silicon carbide and silicon nitride and the like. If a crack occurs in the silicon nitride film serving as a protective film, surface roughness of the substrate cannot be sufficiently suppressed.

SUMMARY OF THE INVENTION

The present invention was made to address such problems, and an object of the present invention is to provide a method of manufacturing a semiconductor device capable of suppressing surface roughness during activation annealing of a substrate made of silicon carbide.

A method of manufacturing a semiconductor device according to the present invention includes the steps of preparing a substrate made of silicon carbide, performing ion implantation into the substrate, forming a protective film made of silicon nitride on the substrate into which the ion implantation was performed, and heating the substrate on which the protective film was formed to a temperature range of 1600° C. or more in an atmosphere containing gas including a nitrogen atom.

In the method of manufacturing a semiconductor device of the present invention, the protective film made of silicon nitride is formed on the substrate made of silicon carbide into which the ion implantation was performed, and then activation annealing is carried out by heating the substrate to the temperature range of 1600° C. or more in the atmosphere containing the gas including a nitrogen atom. Here, even if a crack may occur in the protective film made of silicon nitride, the occurrence of the crack is suppressed by silicon nitride produced by bonding between silicon that leaves the silicon carbide substrate and a nitrogen atom contained in the gas in the atmosphere. As a result, according to the method of manufacturing a semiconductor device of the present invention, surface roughness during the activation annealing of the substrate made of silicon carbide can be suppressed.

In the above method of manufacturing a semiconductor device of the present invention, in the step of heating the substrate, the substrate on which the protective film was formed may be heated to a temperature range of 1900° C. or less. By setting the heating temperature of the substrate to 1900° C. or less, surface roughness of the substrate can be more reliably suppressed by the protective film made of silicon nitride.

In the above method of manufacturing a semiconductor device of the present invention, in the step of heating the substrate, the substrate on which the protective film was formed is heated in an atmosphere containing nitrogen gas. Nitrogen gas is inexpensive and easy to handle, and is thus suitable as the gas constituting the atmosphere (the gas including a nitrogen atom) in the above step of heating the substrate.

In the above method of manufacturing a semiconductor device of the present invention, in the step of forming a protective film, the protective film may be formed by CVD (Chemical Vapor Deposition). The CVD is suitable as a method of forming a protective film made of silicon nitride.

As is clear from the above description, according to the method of manufacturing a semiconductor device of the present invention, a method of manufacturing a semiconductor device capable of suppressing surface roughness during activation annealing of a substrate made of silicon carbide can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
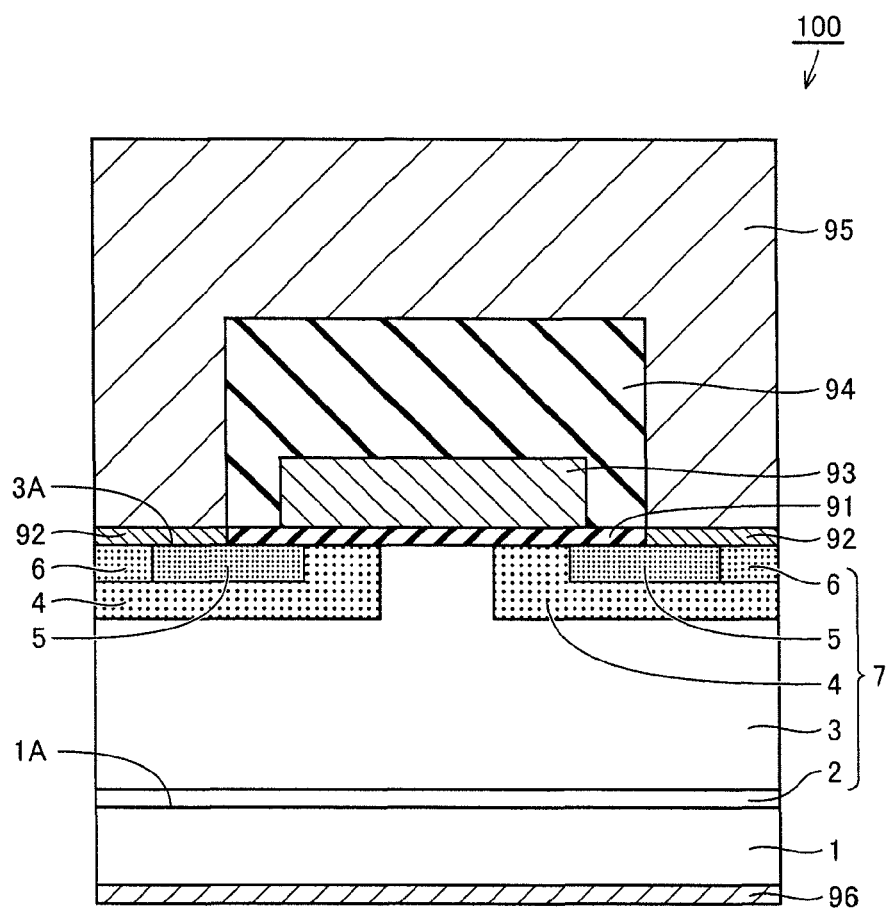
FIG. 1 is a schematic cross-sectional view showing a structure of a MOSFET (Metal Oxide Semiconductor Field Effect Transistor) in one embodiment of the present invention.

An embodiment of the present invention will be described hereinafter with reference to the drawings. It is noted that the same or corresponding parts are designated with the same reference numerals in the drawing below, and description thereof will not be repeated.

First, a semiconductor device that can be manufactured with a method of manufacturing a semiconductor device in one embodiment of the present invention will be described. Referring to FIG. 1, a MOSFET 100 which is a semiconductor device is a DiMOSFET, and includes a silicon carbide substrate 1 of an n conductivity type (first conductivity type), a buffer layer 2 of the n conductivity type made of silicon carbide, a drift layer 3 of the n conductivity type made of silicon carbide, a pair of p type body regions 4 of a p conductivity type (second conductivity type), $n^+$ regions 5 of the n conductivity type, and $p^+$ regions 6 of the p conductivity type.

Buffer layer 2 is formed on one main surface 1A of silicon carbide substrate 1, and is of the n conductivity type by containing an n type impurity. Drift layer 3 is formed on buffer layer 2, and is of the n conductivity type by containing an n type impurity. The n type impurity contained in drift layer 3 is N (nitrogen), for example, and is contained in a concentration (density) lower than that of the n type impurity contained in buffer layer 2. Buffer layer 2 and drift layer 3 constitute an epitaxial growth layer formed on one main surface 1A of silicon carbide substrate 1.

The pair of p type body regions 4 is formed apart from each other in the epitaxial growth layer to include a main surface 3A opposite to a main surface closer to silicon carbide substrate 1, and is of the p conductivity type by containing a p type impurity (an impurity of the p conductivity type). The p type impurity contained in p type body regions 4 is aluminum (Al) and/or boron (B), for example.

Each of $n^+$ regions 5 is formed in each of the pair of p type body regions 4 to include main surface 3A and be surrounded by each of p type body regions 4. $N^+$ regions 5 contain an n type impurity such as P in a concentration (density) higher than that of the n type impurity contained in drift layer 3. Each of $p^+$ regions 6 is formed in each of the pair of p type body regions 4 to include main surface 3A, be surrounded by each of p type body regions 4, and be adjacent to each of $n^+$ regions 5. $P^+$ regions 6 contain a p type impurity such as Al in a concentration (density) higher than that of the p type impurity contained in p type body regions 4. Buffer layer 2, drift layer 3, p type body regions 4, $n^+$ regions 5 and $p^+$ regions 6 constitute an active layer 7.

Referring to FIG. 1, MOSFET 100 further includes a gate oxide film 91 as a gate insulating film, a gate electrode 93, a pair of source contact electrodes 92, an interlayer insulating film 94, a source line 95, and a drain electrode 96.

Gate oxide film 91 is formed on and in contact with main surface 3A of the epitaxial growth layer to extend from an upper surface of one of $n^+$ regions 5 to an upper surface of the other $n^+$ region 5, and is made of silicon dioxide ($SiO_2$), for example.

Gate electrode 93 is arranged in contact with gate oxide film 91 to extend from above one of $n^+$ regions 5 to above the other $n^+$ region 5. Gate electrode 93 is formed of a conductor such as polysilicon including an impurity or Al.

Each of source contact electrodes 92 is arranged in contact with main surface 3A to extend from a top portion of each of the pair of $n^+$ regions 5 in a direction away from gate oxide film 91 to reach a top portion of each of $p^+$ regions 6. Source contact electrodes 92 are made of a material capable of making ohmic contact with $n^+$ regions 5, such as $Ni_xSi_y$ (nickel silicide).

Interlayer insulating film 94 is formed to surround gate electrode 93 above main surface 3A of drift layer 3 and extend from above one of p type body regions 4 to above the other p type body region 4, and is made of silicon dioxide ($SiO_2$) which is an insulator, for example.

Source line 95 surrounds interlayer insulating film 94 above main surface 3A of drift layer 3, and extends to upper surfaces of source contact electrodes 92. Source line 95 is formed of a conductor such as Al, and is electrically connected to $n^+$ regions 5 via source contact electrodes 92.

Drain electrode 96 is formed in contact with a main surface of silicon carbide substrate 1 opposite to the surface on which drift layer 3 is formed. This drain electrode 96 is made of a material capable of making ohmic contact with silicon carbide substrate 1, such as $Ni_xSi_y$, and is electrically connected to silicon carbide substrate 1.

Operation of MOSFET 100 will now be described. Referring to FIG. 1, when gate electrode 93 has a voltage lower than a threshold voltage, i.e., in an off state, a pn junction between each of p type body regions 4 and drift layer 3 located immediately below gate oxide film 91 is reverse biased and non-conducting even if a voltage is applied to the drain electrode. On the other hand, when a voltage equal to or higher than the threshold voltage is applied to gate electrode 93, an inversion layer is formed in a channel region in p type body region 4 which is in contact with gate oxide film 91. As a result, $n^+$ regions 5 and drift layer 3 are electrically connected to each other, causing a current to flow between source line 95 and drain electrode 96.

As has been described, in MOSFET 100, the inversion layer is formed in the channel region in p type body region 4 which is in contact with gate oxide film 91, and a current flows through the inversion layer. If surface roughness occurs in main surface 3A, therefore, resistance in the inversion layer (channel resistance) increases to increase on-resistance. Nevertheless, surface roughness of main surface 3A is reduced and the occurrence of the above problem is suppressed in MOSFET 100 in this embodiment, which is manufactured with the method of manufacturing a semiconductor device in this embodiment to be described below.

Figure 2:
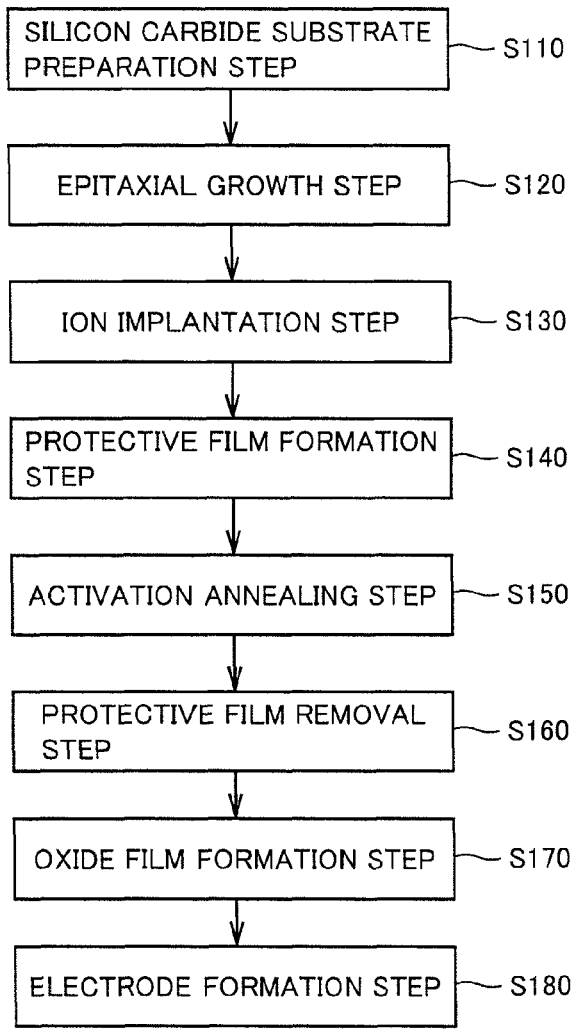
FIG. 2 is a flowchart schematically illustrating a method of manufacturing the MOSFET.
Figure 3:
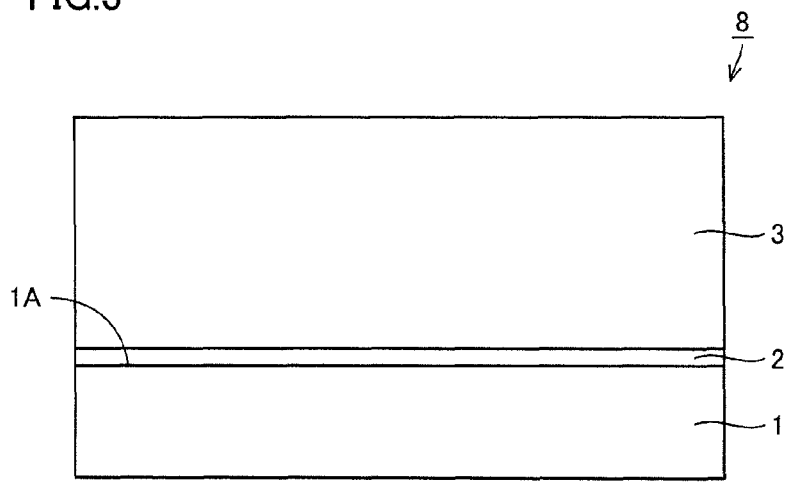
FIG. 3 is a schematic cross-sectional view for explaining the method of manufacturing the MOSFET.
Figure 4:
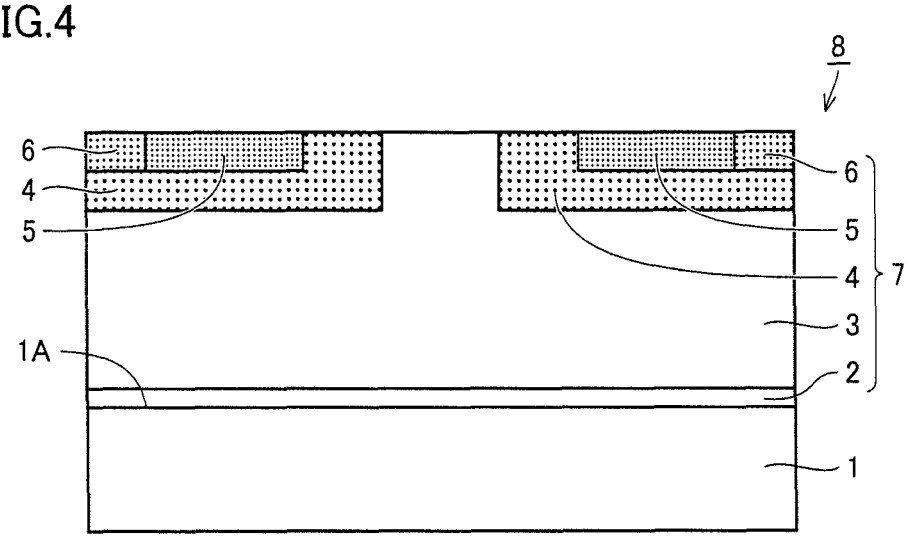
FIG. 4 is a schematic cross-sectional view for explaining the method of manufacturing the MOSFET.
Figure 5:
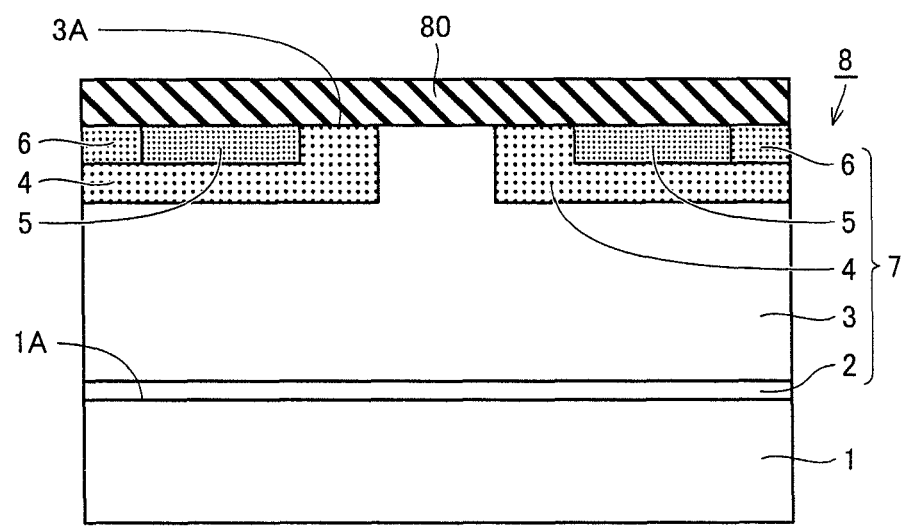
FIG. 5 is a schematic cross-sectional view for explaining the method of manufacturing the MOSFET.

A method of manufacturing MOSFET 100 in this embodiment will now be described with reference to FIGS. 2 to 8. Referring to FIG. 2, in the method of manufacturing MOSFET 100 in this embodiment, a silicon carbide substrate preparation step is first performed as a step (S110). In this step (S110), referring to FIG. 3, silicon carbide substrate 1 obtained by slicing an ingot that has been manufactured with a sublimation method, for example, is prepared.

Next, an epitaxial growth step is performed as a step (S120). In this step (S120), referring to FIG. 3, buffer layer 2 and drift layer 3 made of silicon carbide are successively formed by epitaxial growth on one main surface 1A of silicon carbide substrate 1. As a result, a substrate 8 with an epitaxial growth layer is obtained as a substrate made of silicon carbide.

Next, an ion implantation step is performed as a step (S130). In this step (S130), referring to FIGS. 3 and 4, ion implantation for forming p type body regions 4 is first performed. Specifically, Al (aluminum) ions are implanted into drift layer 3, for example, to form p type body regions 4. Then, ion implantation for forming n⁺ regions 5 is performed. Specifically, P (phosphor) ions are implanted into p type body regions 4, for example, to form n⁺ regions 5 in p type body regions 4. Further, ion implantation for forming p⁺ regions 6 is performed. Specifically, Al ions are implanted into p type body regions 4, for example, to form p⁺ regions 6 in p type body regions 4. Each of these ion implantations can be performed by forming a mask layer, which is made of silicon dioxide ($SiO_2$) and has an opening in a desired region where the ion implantation is to be performed, on a main surface of drift layer 3.

Next, a protective film formation step is performed as a step (S140). In this step (S140), referring to FIG. 5, a protective film 80 made of silicon nitride is formed on main surface 3A of substrate 8 with the epitaxial growth layer into which the ion implantation was performed in step (S130). This protective film 80 can be formed by plasma CVD, for example. Protective film 80 can have a thickness of 0.1 μm or more and 1 μm or less, for example.

Next, an activation annealing step is performed as a step (S150). In this step (S150), substrate 8 with the epitaxial growth layer on which protective film 80 was formed in step (S140) is heated to a temperature range of 1600° C. or more in an atmosphere containing gas including a nitrogen atom. As a result, the impurities introduced into substrate 8 with the epitaxial growth layer by the ion implantation in step (S130) are activated, and p type body regions 4, n⁺ regions 5 and p⁺ regions 6 of the desired conductivity types are obtained.

Figure 6:
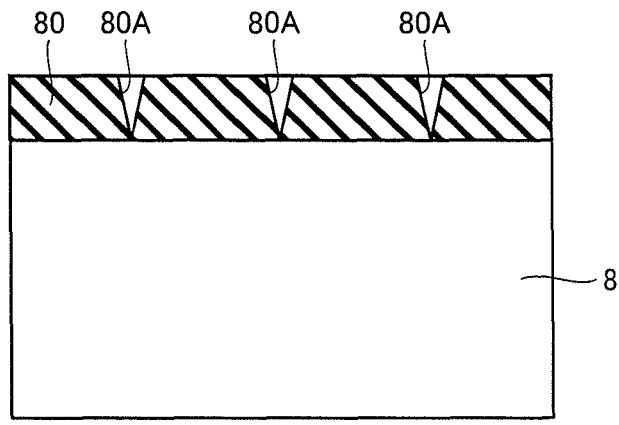
FIG. 6 is a schematic cross-sectional view for explaining the method of manufacturing the MOSFET.

Here, if substrate 8 with the epitaxial growth layer is heated in an argon gas atmosphere in step (S150), for example, cracks 80A may occur in protective film 80 due to the difference in coefficient of linear expansion between silicon carbide and silicon nitride and the like, as shown in FIG. 6. In this case, a silicon atom that has left substrate 8 with the epitaxial growth layer is released into the atmosphere through cracks 80A. As a result, surface roughness occurs.

Figure 7:
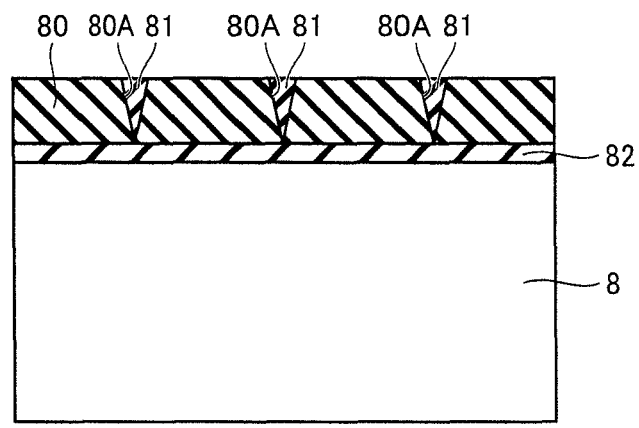
FIG. 7 is a schematic cross-sectional view for explaining the method of manufacturing the MOSFET.

To address this problem, in step (S150) in this embodiment, substrate 8 with the epitaxial growth layer is heated in the atmosphere containing the gas including a nitrogen atom. Accordingly, silicon that has left substrate 8 with the epitaxial growth layer is bonded to nitrogen in the atmosphere, and becomes silicon nitride. As a result, as shown in FIG. 7, a silicon nitride film 82 is formed in a boundary portion between substrate 8 with the epitaxial growth layer and protective film 80, and crack suppression portions 81 made of silicon nitride and filling (repairing) cracks 80A are formed. The occurrence and growth of cracks 80A is thus suppressed, thereby reducing the occurrence of surface roughness.

For example, nitrogen gas, ammonia gas, nitrogen monoxide gas, or nitrogen dioxide gas may be employed as the above gas including a nitrogen atom. Nitrogen gas is inexpensive and easy to handle, and is thus particularly suitable as the above gas including a nitrogen atom. Further, in step (S150), substrate 8 with the epitaxial growth layer may be heated in a nitrogen gas atmosphere.

Moreover, in step (S150), it is preferable that the heating temperature of substrate 8 with the epitaxial growth layer be set to 1900° C. or less. By setting the heating temperature of substrate 8 with the epitaxial growth layer to 1900° C. or less, surface roughness can be more reliably suppressed by protective film 80 made of silicon nitride, silicon nitride film 82 and crack suppression portions 81. On the other hand, in terms of increasing a percentage of activation of the impurities introduced by the ion implantation, it is preferable that the heating temperature of substrate 8 with the epitaxial growth layer in step (S150) be set to 1700° C. or more, e.g., to 1800° C.

Next, a protective film removal step is performed as a step (S160). In this step (S160), protective film 80 is removed. Protective film 80 may be removed with liquid containing hydrofluoric acid, or in a plasma process using fluorine, for example.

Next, an oxide film formation step is performed as a step (S170). In this step (S170), referring to FIG. 8, oxide film (gate oxide film) 91 is formed by conducting heat treatment of heating the substrate to 1300° C. in an oxygen atmosphere and maintaining the substrate for 60 minutes, for example.

Figure 8:
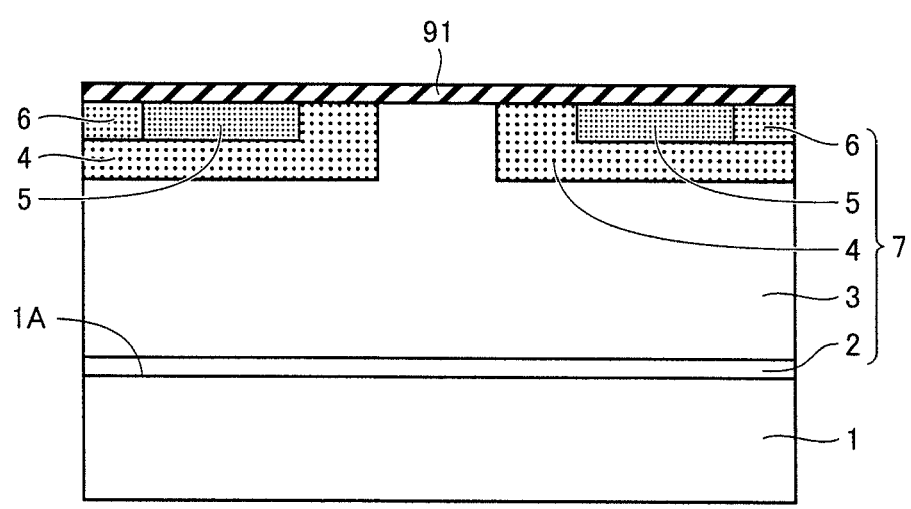
FIG. 8 is a schematic cross-sectional view for explaining the method of manufacturing the MOSFET.

Next, an electrode formation step is performed as a step (S180). Referring to FIGS. 8 and 1, in this step (S180), first, gate electrode 93 made of polysilicon which is a conductor including a high concentration of impurity is formed by CVD, photolithography and etching, for example. Then, interlayer insulating film 94 made of $SiO_2$ which is an insulator is formed by CVD, for example, to surround gate electrode 93 above main surface 3A. Then, interlayer insulating film 94 and oxide film 91 in a region where source contact electrode 92 is to be formed are removed by photolithography and etching. Then, a nickel (Ni) film formed by an evaporation method, for example, is heated and silicidized, to form source contact electrode 92 and drain electrode 96. Then, source line 95 made of Al which is a conductor is formed by an evaporation method, for example, to surround interlayer insulating film 94 above main surface 3A and extend to the upper surfaces of n⁺ regions 5 and source contact electrodes 92. Following the above procedure, MOSFET 100 in this embodiment is completed.

As has been described, in the method of manufacturing MOSFET 100 in this embodiment, even if cracks 80A may occur in protective film 80 made of silicon nitride in step (S150), the occurrence of cracks 80A is suppressed by the silicon nitride produced by the bonding between silicon that leaves substrate 8 with the epitaxial growth layer and a nitrogen atom contained in the gas in the atmosphere. As a result, according to the method of manufacturing MOSFET 100 in this embodiment, surface roughness during the activation annealing of substrate 8 with the epitaxial growth layer can be suppressed.

While the manufacture of a MOSFET has been described in the above embodiment as an example of the method of manufacturing a semiconductor device of the present invention, semiconductor devices that can be manufactured with the manufacturing method of the present invention are not limited as such. The method of manufacturing a semiconductor device of the present invention is widely applicable to methods of manufacturing semiconductor devices employing a process of performing ion implantation into a substrate made of silicon carbide, and then carrying out activation annealing, and is more specifically applicable to methods of manufacturing a JFET (Junction Field Effect Transistor), an IGBT (Insulated Gate Bipolar Transistor) and the like.

The method of manufacturing a semiconductor device of the present invention is particularly advantageously applicable to a method of manufacturing a semiconductor device employing a process of performing ion implantation into a substrate made of silicon carbide, and then carrying out activation annealing.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method of manufacturing a semiconductor device, comprising the steps of:

preparing a substrate made of silicon carbide;

performing ion implantation into said substrate;

forming a protective film made of silicon nitride on said substrate into which said ion implantation was performed; and heating said substrate on which said protective film was formed to a temperature range of 1600° C. or more in an atmosphere containing gas including a nitrogen atom to generate silicon nitride by extracting silicon from said substrate through a crack of said protective film and bonding said silicon and nitrogen in said gas, and wherein said protective film is repaired by said silicon nitride generated through said heating.

2. The method of manufacturing a semiconductor device according to claim 1, wherein in said step of heating said substrate, said substrate on which said protective film was formed is heated to a temperature range of 1900° C. or less.

3. The method of manufacturing a semiconductor device according to claim 1, wherein in said step of heating said substrate, said substrate on which said protective film was formed is heated in an atmosphere containing nitrogen gas.

4. The method of manufacturing a semiconductor device according to claim 1, wherein in said step of forming a protective film, said protective film is formed by CVD.

5. The method of manufacturing a semiconductor device according to claim 1, wherein a crack of said protective film is repaired by said silicon nitride.

6. The method of manufacturing a semiconductor device according to claim 1, wherein said gas including a nitrogen atom contains nitrogen gas, ammonia gas, nitrogen monoxide gas, or nitrogen dioxide gas.

* * * * *